United States Patent
Camagna et al.

(10) Patent No.: US 7,469,348 B2
(45) Date of Patent: Dec. 23, 2008

(54) METHOD FOR DYNAMIC INSERTION LOSS CONTROL FOR 10/100/1000 MHZ ETHERNET SIGNALING

(75) Inventors: John R. Camagna, El Dorado Hills, CA (US); Phillip John Crawley, Folsom, CA (US)

(73) Assignee: Akros Silicon, Inc., Folsom, CA (US)

( * ) Notice: Subject to any disclaimer, the term of this patent is extended or adjusted under 35 U.S.C. 154(b) by 571 days.

(21) Appl. No.: 11/207,602

(22) Filed: Aug. 19, 2005

(65) Prior Publication Data
US 2006/0238250 A1 Oct. 26, 2006

Related U.S. Application Data

(60) Provisional application No. 60/665,766, filed on Mar. 28, 2005.

(51) Int. Cl.
*G06F 1/00* (2006.01)
*G01R 27/04* (2006.01)
*H03B 1/00* (2006.01)

(52) U.S. Cl. .................. 713/300; 324/641; 375/350

(58) Field of Classification Search .................. 713/300
See application file for complete search history.

(56) References Cited

U.S. PATENT DOCUMENTS

| 6,904,110 B2 * | 6/2005 | Trans et al. ................. 375/350 |
| 6,985,099 B1 * | 1/2006 | Luz et al. ..................... 341/139 |
| 7,034,546 B2 * | 4/2006 | Manani et al. .............. 324/539 |
| 2005/0264299 A1 * | 12/2005 | Manani et al. .............. 324/539 |

FOREIGN PATENT DOCUMENTS

| JP | 10144984 A | * | 5/1998 |
| JP | 2001016342 A | * | 1/2001 |

OTHER PUBLICATIONS

Aparin et al, Active GaAs MMIC Band-Pass Filters with Automatic Frequency Tuning and Insertion Loss Control, Oct. 1995, IEEE Journal of solid-state circuits, vol. 30, No. 10, pp. 6.*

* cited by examiner

*Primary Examiner*—Suresh K Suryawanshi

(57) ABSTRACT

Dynamic insertion insertion loss for an ethernet power on differential cable pairs is shown in a power feed circuit that supplies power to a network attached device (PD). An insertion loss control circuit limits power loss in a coupled power feed circuit. determines an insertion loss limit, and senses an average power of the power signals to produce a common mode feedback signal to the power feed circuit.

21 Claims, 15 Drawing Sheets

METHOD FOR DYNAMIC INSERTION LOSS CONTROL FOR 10/100/1000 MHZ ETHERNET SIGNALING

CROSS REFERENCE TO RELATED APPLICATIONS

This application claims the benefit of priority to and incorporates herein by reference in its entirety for all purposes, U.S. Provisional Patent Application No. 60/665,766 entitled "SYSTEMS AND METHODS OPERABLE TO ALLOW LOOP POWERING OF NETWORKED DEVICES," by John R. Camagna, et al. filed on Mar. 28, 2005. This application is related to and incorporates herein by reference in its entirety for all purposes, U.S. patent application Ser. Nos.: 60/665,766 entitled "SYSTEMS AND METHODS OPERABLE TO ALLOW LOOP POWERING OF NETWORKED DEVICES," by John R. Camagna, et al.; 11/207,595 entitled "METHOD FOR HIGH VOLTAGE POWER FEED ON DIFFERENTIAL CABLE PAIRS," by John R. Camagna, et al., which have been filed concurrently.

TECHNICAL FIELD OF THE INVENTION

The present invention relates generally to power distribution, and more particularly to reducing inefficiencies associated with distributing power over a high bandwidth network.

BACKGROUND OF THE INVENTION

Many networks such as local and wide area networks (LAN/WAN) structures are used to carry and distribute data communication signals between devices. The various network elements include hubs, switches, routers, and bridges, peripheral devices, such as, but not limited to, printers, data servers, desktop personal computers (PCs), portable PCs and personal data assistants (PDAs) equipped with network interface cards. All these devices that connect to the network structure require power in order to operate. The power of these devices may be supplied by either an internal or an external power supply such as batteries or an AC power via a connection to an electrical outlet.

Some network solutions offer to distribute power over the network in addition to data communications. The distribution of power over a network consolidates power and data communications over a single network connection to reduce the costs of installation, ensures power to key network elements in the event of a traditional power failure, and reduces the number of required power cables, AC to DC adapters, and/or AC power supplies which create fire and physical hazards. Additionally, power distributed over a network such as an Ethernet network may provide an uninterruptible power supply (UPS) to key components or devices that normally would require a dedicated UPS.

Additionally, the growth of network appliances, such as but not limited to, voice over IP (VOIP) telephones require power. When compared to their traditional counterparts, these network appliances require an additional power feed. One drawback of VOIP telephony is that in the event of a power failure, the ability to contact to emergency services via an independently powered telephone is removed. The ability to distribute power to network appliances or key circuits would allow network appliances, such as the VOIP telephone, to operate in a similar fashion to the ordinary analog telephone network currently in use.

The distribution of power over Ethernet network connections is in part governed by the IEEE Standard 802.3 and other relevant standards. These standards are incorporated by reference. However, these power distribution schemes within a network environment typically require cumbersome, real estate intensive, magnetic transformers. Additionally, power over Ethernet (PoE) requirements under 802.3 are quite stringent and often limit the allowable power.

There are many limitations associated with using these magnetic transformers. Transformer core saturation can limit the current that can be sent to a power device (PD). This may further limit the performance of the communication channel. The cost and board space associated with the transformer comprise approximately 10 percent of printed circuit board (PCB) space within a modern switch. Additionally, failures associated with transformers often account for a significant number of field returns. The magnetic fields associated with the transformers can result in lower electromagnetic interference (EMI) performance.

However, magnetic transformers also perform several important functions such as providing DC isolation and signal transfer in network systems.

Additionally there are many power losses associated with feeding power to the PD. One particular loss is the insertion loss that can vary with the data rate and transmission lines. Minimizing these losses allows the power fed to the PD to be maximized. Thus, there is a need for an improved approach to distributing power in a network environment that addresses limitations imposed by magnetic transformers while maintaining the benefits thereof.

SUMMARY OF THE INVENTION

Embodiments of the present invention provides a method for dynamic insertion loss control for a 10/100/1000/10000 megahertz Ethernet power device (PD) that substantially addresses the above-identified needs as well as others. More specifically, one embodiment of the present invention provides an insertion loss control circuit operable to limit power loss in a coupled power feed circuit. The insertion loss control circuit includes a first amplifier, a rectifier, and a loop filter. The first amplifier receives a pair of network power signals. From these power signals, the amplifier generates a power estimate signal associated with the network power signal. Then the rectifier converts the power estimate into a single-ended rectified power estimate that the loop filter uses to produce a common-mode control signal whose speed is based on the received pair of network power signals.

Another embodiment provides a power feed circuit operable to supply power to at least a portion of an Ethernet (i.e. network-attached) PD. This power feed circuit includes two differential transistor pairs, two pairs of differential impedances, insertion loss control circuit(s), a common-mode feedback amplifier, a differential amplifier, and a pair of output nodes. The two differential transistor pairs each are operable to receive and pass an Ethernet power signal. The differential impedances each individually couple to a differential transistor drain. The differential impedances pass the Ethernet power signal and produce an input voltage to the differential amplifier. The insertion loss control circuit provides an insertion loss limit to a common-mode feedback amplifier. Then the common-mode feedback amplifier senses an average Ethernet power signal and produces a common-mode feedback signal. The differential amplifier receives the common-mode feedback signal and the differential voltage across the differential impedances. The differential amplifier then produces and applies a control or feedback signals to the gate of each transistor within the coupled based on the differential voltage sensed by the differential amplifier and the common-mode feedback signal. This signal drives the Ethernet power signals passed by each transistor to of a differential transistor pair to be equal while also reducing the insertion loss to or below the insertion loss limit. A pair of output nodes wherein a single node is associated with each differential transistor pair is used to feed power from the power feed circuit to the network-attached PD.

The insertion loss limit may be determined logically by higher layers of the Ethernet protocol and be based on the Ethernet communication signal or it may be determined based on the differential RMS of the received Ethernet power signals as seen by a differential transistor pair. When the insertion loss limit is determined based on the differential RMS, the insertion loss control circuit is operable to automatically reduce the insertion loss based upon transmission losses experienced between the power sending equipment (PSE) and network attached PD.

The power feed circuit may be implemented as a set of discrete components on a printed circuit board or network interface card, or alternatively, it can be implemented in an integrated circuit (IC) that may contain other functional units or modules. This power feed circuit and additional embodiments may further include splitting circuitry operable to separate data signals from the network power signal and then pass the data signal to a network physical layer (PHY) module. This splitting circuitry may include direct current (DC) blocking capacitors in order to separate the data signal from the network power signal. Other embodiments of the power feed circuit may include or couple to a protection circuit and/or a rectifying/switching circuit. Such a protection circuit may provide surge protection (i.e. voltage spike and lightning protection) for incoming network signals. The rectifying/switching circuit may receive the output of the protection circuit and rectify or switch the power signal to ensure power with a proper polarity is applied to the IC. The protection and rectifying/switching circuits may not be required in a back plane application where the polarity of the power signal is known.

Yet another embodiment provides a method to at least partially power a network attached PD from a network power signal sent through the network connection. This involves receiving pairs of Ethernet power signals that may be passed through differential transistor pairs. The gates of the differential transistor pairs are dynamically adjusted to limit the insertion loss and equalize power passed through individual differential transistors. This may be done by sensing a drain voltage at the drain of each transistor to produce a differential feedback signal to be applied. A common-mode feedback signal is produced by determining an insertion loss limit associated with the Ethernet power signal. This insertion loss limit is used to determine a common-mode feedback signal. The common-mode feedback signal combines with the differential feedback signal and then is applied as a control signal to the gate of the transistors. Wherein the control signal enables the individual transistors to equalize the power network power signals passed and limit the insertion loss associated with the network power signals. Then these network power signals feed to a power management circuit for the PD to be powered.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION

Figure 1A:
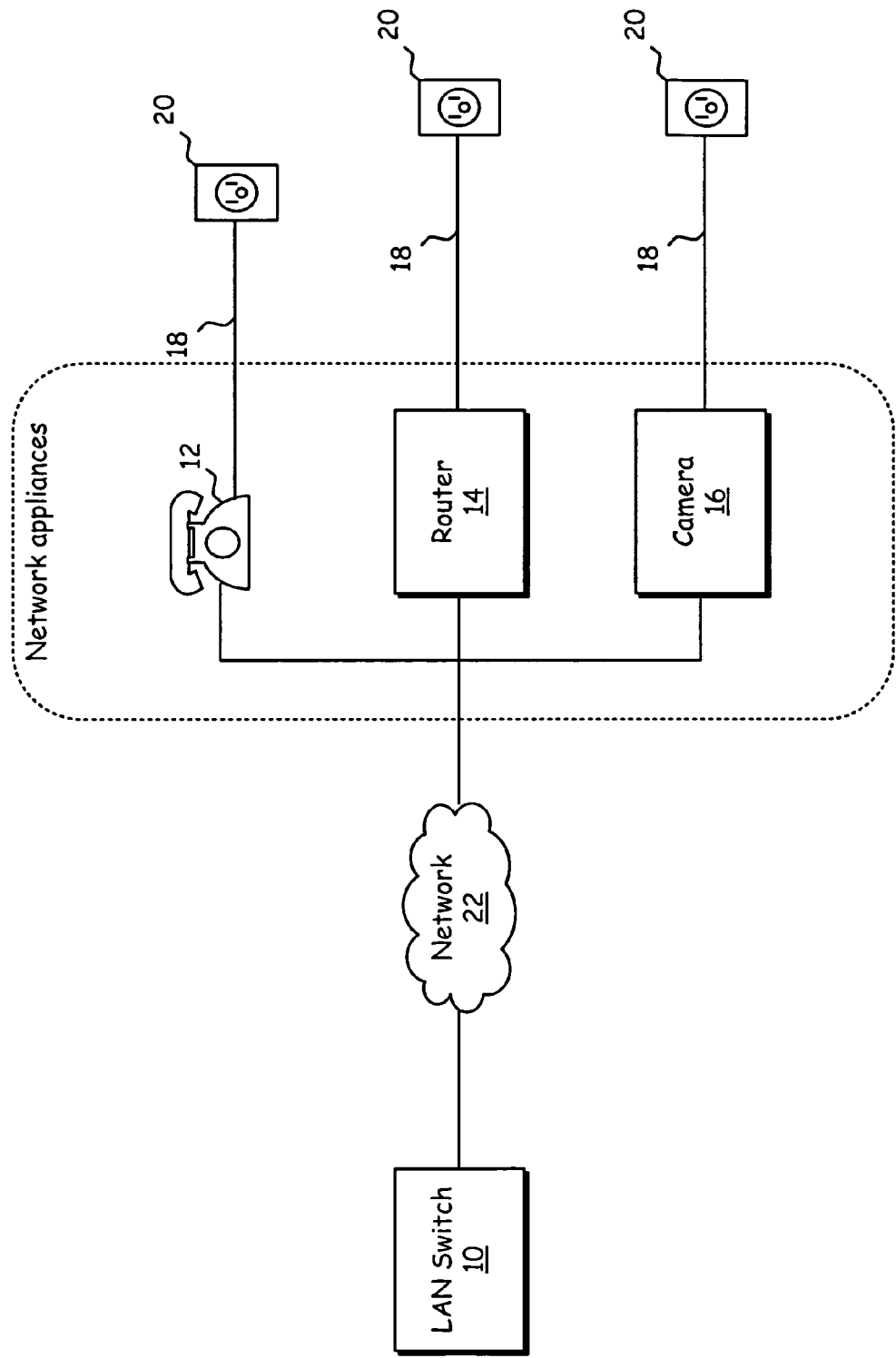
FIG. 1A depicts current Ethernet network appliances attached to the network and powered separately and their separate power connections.

Preferred embodiments of the present invention are illustrated in the FIGs., like numerals being used to refer to like and corresponding parts of the various drawings.

The 802.3 Ethernet network Standards, which is incorporated herein by reference, allow loop powering of remote Ethernet network devices (802.3). The Power over Ethernet (PoE) standard and other like standards intends to standardize the delivery of power over Ethernet network cables in order to have remote client devices powered through the network connection. The side of link that supplies the power is referred to as Powered Supply Equipment (PSE). The side of link that receives the power is referred to as the Powered device (PD).

Replacing the magnetic transformer of prior PoE systems while maintaining the functionality of the transformer has been subsumed into the embodiments of the present invention. In order to subsume the functionality of the transformer, the circuits provided by embodiments of the present invention, which may take the form of ICs or discrete components, are operable to handle these functions. These functions may include, in the case of an Ethernet network application:

1) coupling of a maximum of 57V (SELV) to the IC with the possibility of 1V peak-peak swing of a 10/100/1000 M Ethernet signaling, (2.8Vp_p for MAU device);

2) splitting the signal; 57V DC to the 802.3af Power Control unit and AC data signal to the PHY (TX and RX), while meeting the high voltage stress.
3) coupling lower voltage (5 v and 3.3 v) PHY transceiver to high voltage cable (57V)
4) supplying power of 3.3V or 12V through DC-DC converter;
5) withstanding system-level lighting strikes: indoor lighting strike (ITU K.41); outdoor lighting strike (IEC 60590)
6) withstanding power cross @60 Hz. (IEC 60590)
7) fully supporting IEEE 802.3af Specification Other network protocols may allow different voltage (i.e., a 110 volt circuit coupling to the IC) data rates (i.e., 1 GBPS or higher), and power rating.

In a solid-state implementation, common mode isolation between the earth ground of the device and the cable is not necessarily required. Fixed common mode offsets of up to 1500V are possible in traditional telephony systems. Embodiments of the present invention discussed herein may deliver power via cable where the earth ground is used solely for grounding of the PD chassis. As there is no electrical connection between the earth and PoE ground, large voltage offsets are allowable.

Second, another transformer function provides surge and voltage spike protection from lightning strike and power cross faults. Wires inside the building comply with the ITU recommendation K.41 for lightning strikes. Lines external to the building must comply with IEC60590. Lightning strike testing as specified in these Standards consists in a common mode voltage surge applied between all conductors and the earth or chassis ground. As embodiments of the present invention uses the earth ground only for chassis protection, minimal stress will occur across the device, thus simplifying the circuits required by embodiments of the present invention.

According to one 802.3.af power scheme, power is delivered via the center tap of the line side transformer to receive signal transformers for transformer based designs. This will be discussed in more detail with reference to FIGS. 4A and 4B. The embodiments of the present invention may take up to 400ma DC from the common mode of the signal pair without disturbing the AC (1 MHz-100 MHz) differential signals on the transmit/receive pairs. Further insertion power losses associated with the differential signal should be minimal in order to maximize useful power supplied via the network connection to the PD. Embodiments of the present invention may support PoE side applications as well.

Embodiments of the present invention are operable to support PoE side applications as well. As several functions are integrated together, the entire IC ground will track the Ethernet line ground. This means that the IC potential will vary significantly (1500V) from the chassis ground. As no power is necessary from the local supply, the voltage drop will occur across an air gap.

Figure 1B:
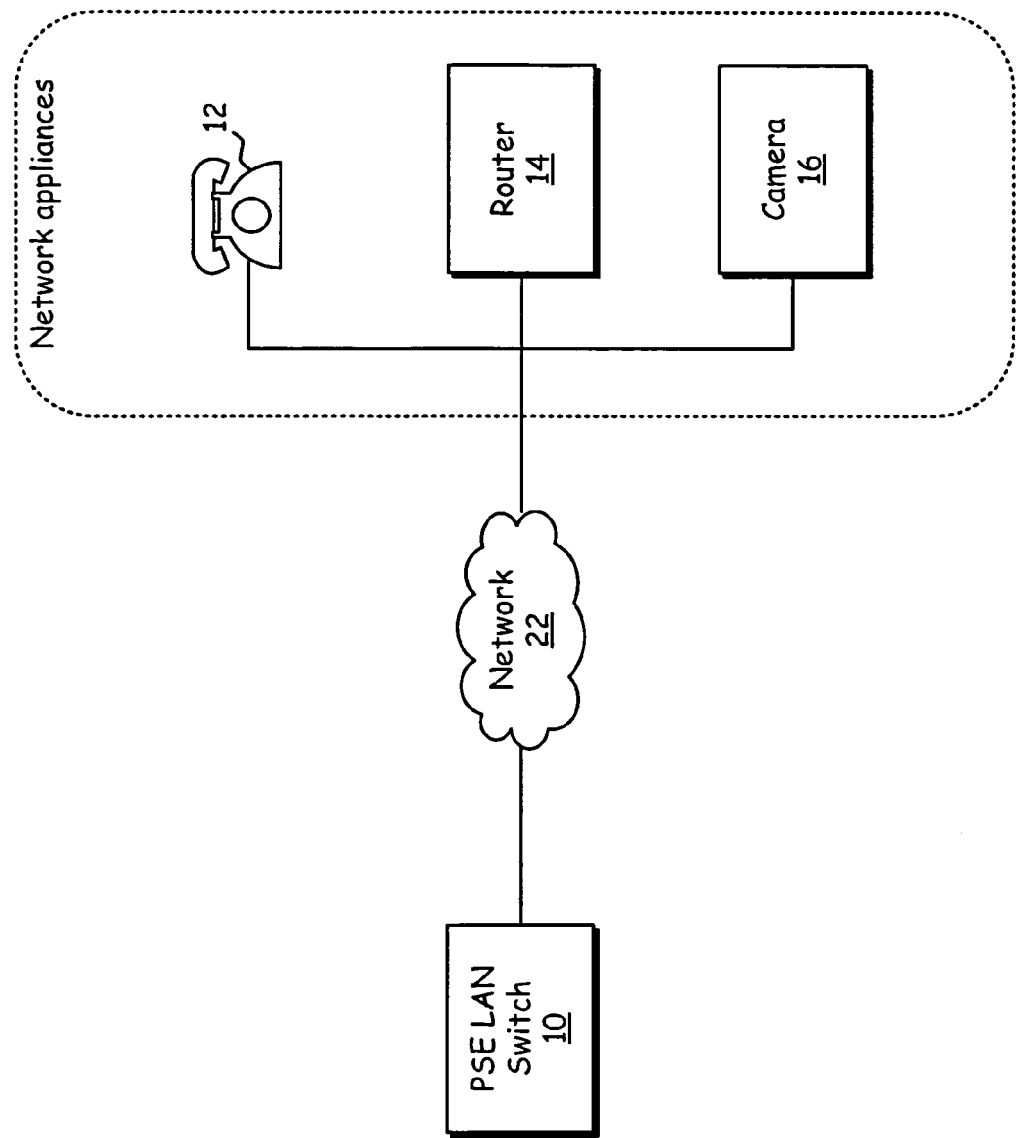
FIG. 1B depicts various Ethernet network powered devices (PDs) in accordance with embodiments of the present invention.

FIG. 1A illustrates exemplary devices where power is supplied separately to network attached client devices 12-16 that may benefit from receiving power and data via the network connection. These devices are serviced by LAN switch 10 for data. Additionally, each client device 12-16 has separate power connections 18 to electrical outlets 20. FIG. 1B illustrates exemplary devices where switch 10 is a power supply equipment (PSE) capable power-over Ethernet (PoE) enabled LAN switch that provides both data and power signals to client devices 12-16. The network attached devices may include VoIP telephone 12, access points, routers, gateways 14 and/or security cameras 16, as well as other known network appliances. This eliminates the need for client devices 12-16 to have separate power connections 18 to electrical outlets 20 as shown in FIG. 1A which are no longer required in FIG. 1B. Eliminating this second connection ensures that the network attached device will have greater reliability when attached to the network with reduced cost and facilitated deployment.

Specific embodiments of the present invention may be incorporated within various powered network attached devices or Ethernet network appliances. Such appliances include, but are not limited to VoIP telephones, routers, printers, and other like devices known to those having skill in the art. Such exemplary devices are illustrated in FIG. 1B.

Figure 2A:
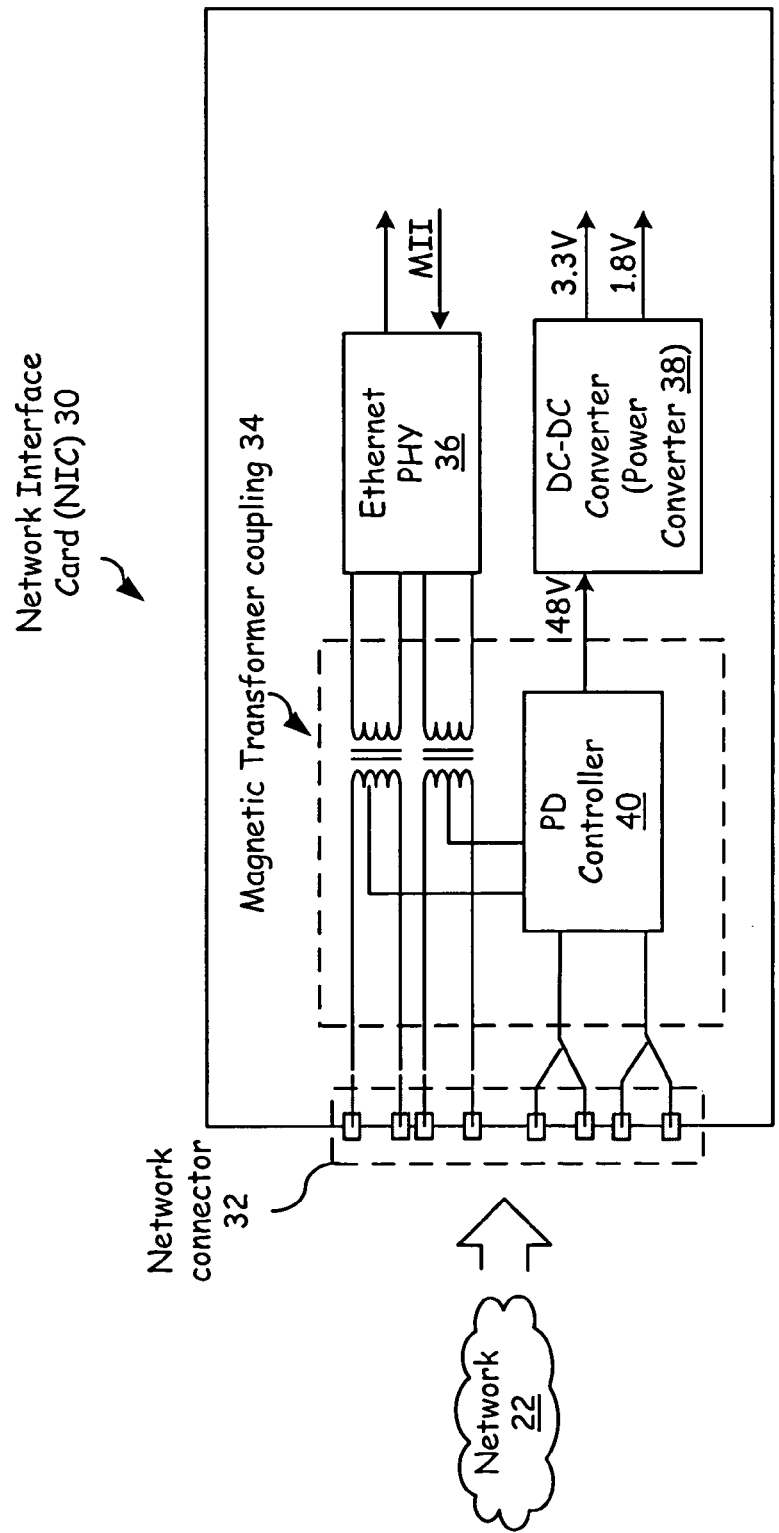
FIG. 2A shows a traditional real-estate intensive transformer based Network Interface Card (NIC)

FIG. 2A provides a typical prior art network interface card 30 for a PD that includes network connector 32, magnetic transformer 34, Ethernet PHY 36, power converter 38, and PD controller 40. Typically, these elements are all separate and discrete devices. Embodiments of the present invention are operable to eliminate the magnetic network transformer 34 and replace this discrete device with a power feed circuit such as the one provided in FIGS. 8A and 8B or one operable to perform the functions described with respect to the logic flow diagram of FIG. 9. This power feed circuit may be implemented within an integrated circuit (IC) or as discrete components. Additionally, embodiments of the present invention may incorporate other functional specific processors, or any combination thereof into a single IC.

Figure 2B:
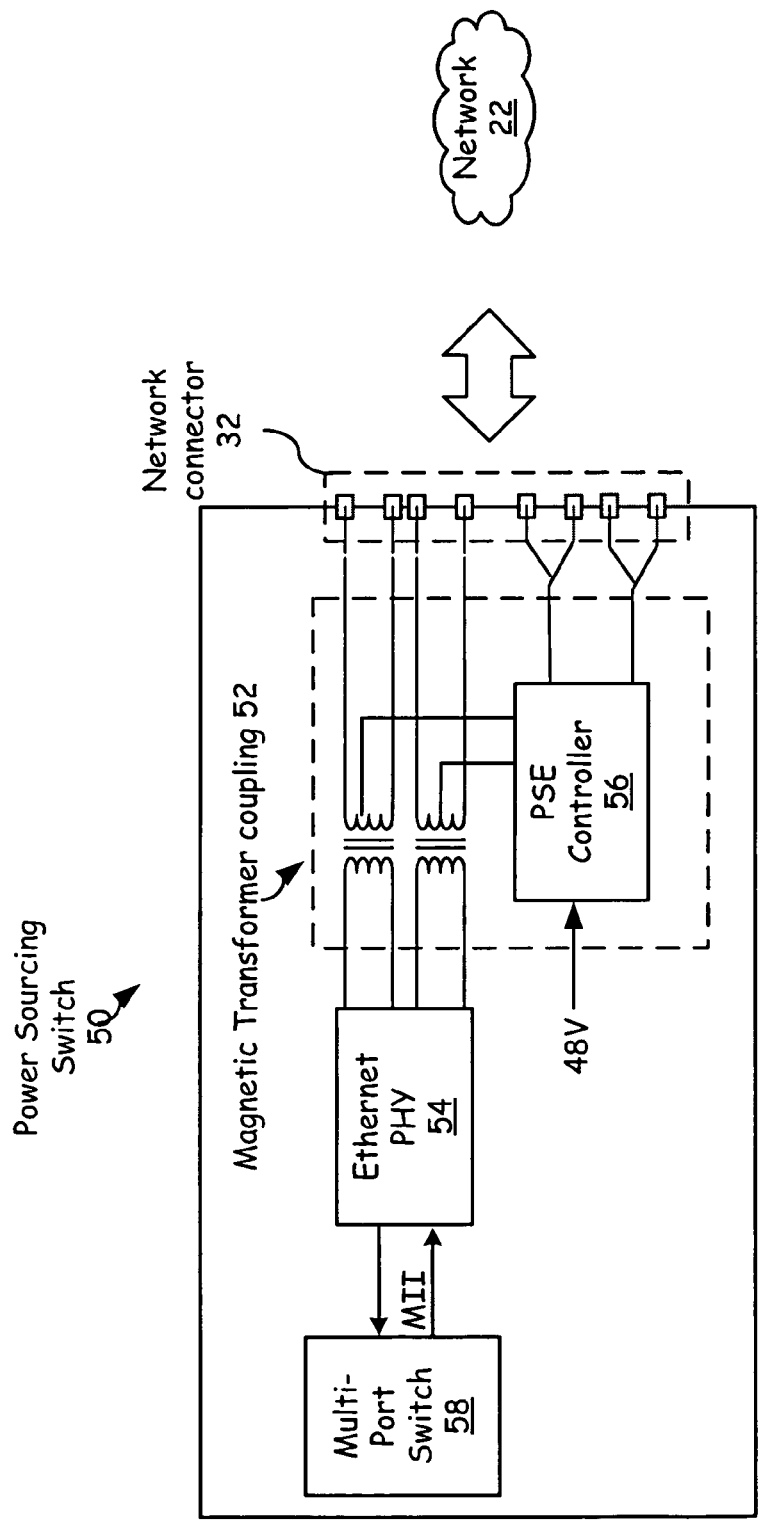
FIG. 2B provides a traditional functional block diagram of magnetic-based transformer power supply equipment (PSE)

FIG. 2B provides a typical PSE prior art device. Here, power sourcing switch 50 includes a network connector 32, magnetically coupled transformer 52, Ethernet physical layer (PHY) 54, PSE controller 56, and multi-port switch 58. Typically these elements are all separate and discreet devices. Embodiments of the present invention may eliminate the magnetically coupled transformer 52 and replace this transformer with discreet devices that may be implemented within ICs or as discreet devices that minimizes insertion loss in order to increase power fed to downstream components. Such power feed circuits are discussed with reference to FIG. 7 and following.

Although the description herein may focus and describe a system and method for coupling high bandwidth data signals and power distribution between the IC and cable that uses transformer-less ICs with particular detail to the 802.3af Ethernet network standard, these concepts may be applied in non-Ethernet network applications and non 802.3af applications. Further, these concepts may be applied in subsequent standards that supersede the 802.3af standard.

Embodiments of the present invention may provide solid state (non-magnetic) transformer circuits operable to couple high bandwidth data signals and power signals with new mixed-signal IC technology in order to eliminate cumbersome, real-estate intensive magnetic-based transformers 34 and 52 as pictured in FIGS. 2A and 2B.

Modern communication systems use transformers 34 and 52 to provide common mode signal blocking, 1500 volt isolation, and AC coupling of the differential signature as well as residual lightning or electromagnetic shock protection. These functions are replaced by a solid state or other like circuits in accordance with embodiments of the present invention wherein the circuit may couple directly to the line and provide high differential impedance and low common mode impedance. High differential impedance allows separation of the PHY signal form the power signal. The low common mode impedance removes the need for a choke. This allows power to be tapped from the line. The local ground plane may float in order to eliminate the need for 1500 volt isolation. Additionally through a combination of circuit techniques and lightning protection circuitry, it is possible to provide voltage spike or lightning protection to the network attached device. This eliminates another function performed by transformers in traditional systems or arrangements. It should be understood that the technology may be applied anywhere where transformers are used and should not be limited to Ethernet network applications.

Figure 3A:
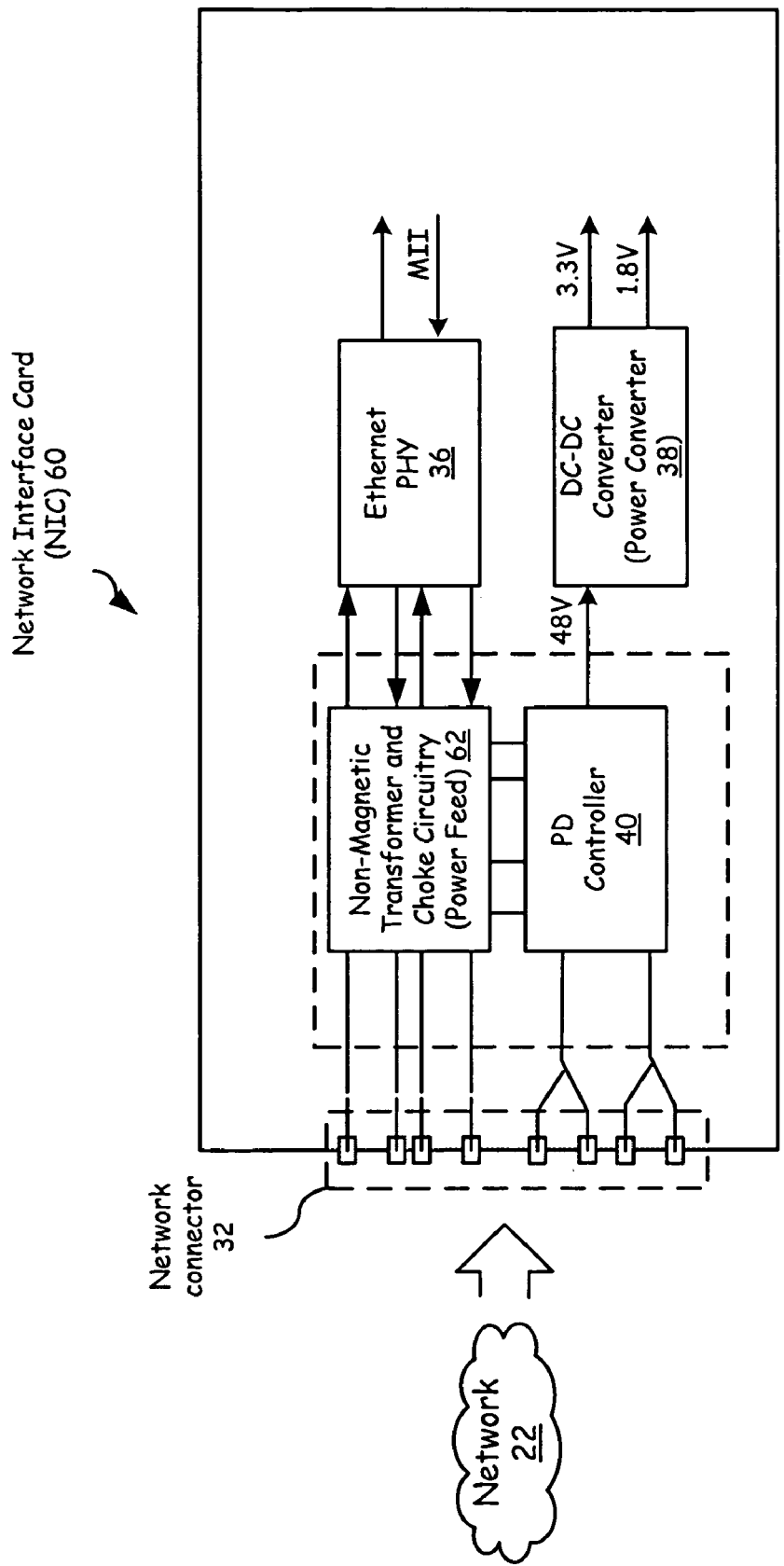
FIG. 3A provides a functional block diagram of a network powered device interface utilizing non-magnetic transformer and choke circuitry in accordance with embodiments of the present invention.

FIG. 3A is a functional block diagram of a network interface 60 that includes network connector 32, non-magnetic transformer and choke power feed circuitry 62, network physical layer 36, and power converter 38. Thus, FIG. 3A replaces magnetic transformer 34 with circuitry 62. In the context of an Ethernet network interface, network connector 32 may be a RJ45 connector operable to receive a number of twisted pairs. Protection and conditioning circuitry may be located between network connector 32 and non-magnetic transformer and choke power feed circuitry 62 to provide surge protection in the form of voltage spike protection, lighting protection, external shock protection or other like active functions known to those having skill in the art. Conditioning circuitry may take the form of a diode bridge or other like rectifying circuit. Such a diode bridge may couple to individual conductive lines 1-8 contained within the RJ45 connector. These circuits may be discrete components or an integrated circuit within non-magnetic transformer and choke power feed circuitry 62.

In an Ethernet network application, the 802.3af standard (PoE standard) provides for the delivery of power over Ethernet cables to remotely power devices. The portion of the connection that receives the power may be referred to as the powered device (PD). The side of the link that provides the power is referred to as the power sourcing equipment (PSE). Two power feed options allowed in the 802.3af standard are depicted in FIG. 4A. In the first alternative, which will be referred to as alternative A, LAN switch 70, which contains PSE 76 feeds power to the Ethernet network attached device (PD) 72 along the twisted pair cable 74 used for the 10/100 Ethernet signal via the center taps 80 of Ethernet transformers 82. On the line side of the transfer, transformers 84 deliver power to PD 78 via conductors 1 and 2 and the center taps 86 and return via conductors 3 and 6 and the center taps 86. In the second alternative, conductors 4, 5, 7 and 8 are used to transmit power without transformers. Conductors 4, 5, 7 and 8 remain unused for 10/100 Ethernet data signal transmissions. FIG. 4B depicts that the network interface of FIG. 3A and power sourcing switch of FIG. 3B may be used to implements these alternatives and their combinations as well.

Returning to FIG. 3A, conductors 1 through 8 of the network connector 32, when this connector takes the form of an RJ45 connector, couple to non-magnetic transformer and choke power feed circuitry 62 regardless of whether the first or second alternative provided by 802.3af standard is utilized. These alternatives will be discussed in more detail with reference to FIGS. 5A and 5B. Non-magnetic transformer and choke power feed circuitry 62 may utilize the power feed circuit of FIGS. 7, 8A and 8B to receive and separate the data signal portion from the power signal portion. This data signal portion may then be passed to network physical layer 36 while the power signal is passed to power converter 38.

In the instance where network interface 60 is used to couple the network attached device or PD to an Ethernet network, network physical layer 36 may be operable to implement the 10 Mbps, 100 Mbps, and/or 1 Gbps physical layer functions as well as other Ethernet data protocols that may arise. The Ethernet PHY 36 may additionally couple to an Ethernet media access controller (MAC). The Ethernet PHY 36 and Ethernet MAC when coupled are operable to implement the hardware layers of an Ethernet protocol stack. This architecture may also be applied to other networks. Additionally, in the event that a power signal is not received but a traditional, non-power Ethernet signal is received the nonmagnetic power feed circuitry 62 will still pass the data signal to the network PHY.

The power signal separated from the network signal within non-magnetic transformer and choke power feed circuit 62 by the power feed circuit is provided to power converter 38. Typically the power signal received will not exceed 57 volts SELV (Safety Extra Low Voltage). Typical voltage in an Ethernet application will be 48-volt power. Power converter 38 may then further transform the power as a DC to DC converter in order to provide 1.8 to 3.3 volts, or other voltages as may be required by many Ethernet network attached devices.

Non-magnetic power feed circuitry eliminates the use of magnetic transformers within integrated system solutions. These integrated solutions provide the opportunity to increase system density by replacing magnetic transformers with power feed circuitry in the form of an IC or discreet elements such as those described by circuits provided in FIG. 7 and following.

Figure 3B:
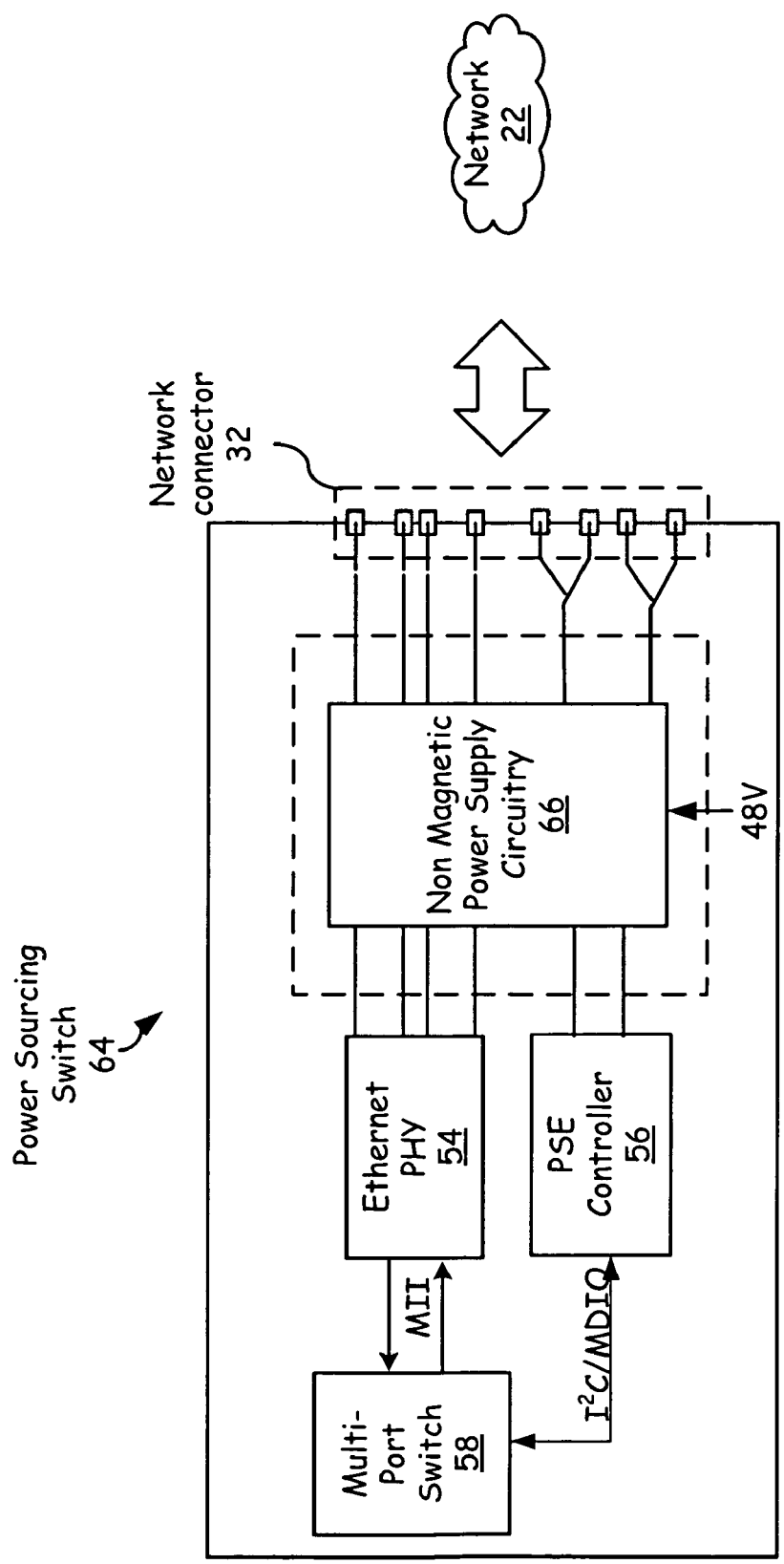
FIG. 3B provides a functional block diagram of a PSE utilizing non-magnetic transformer and choke circuitry in accordance with embodiments of the present invention.
Figure 4A:
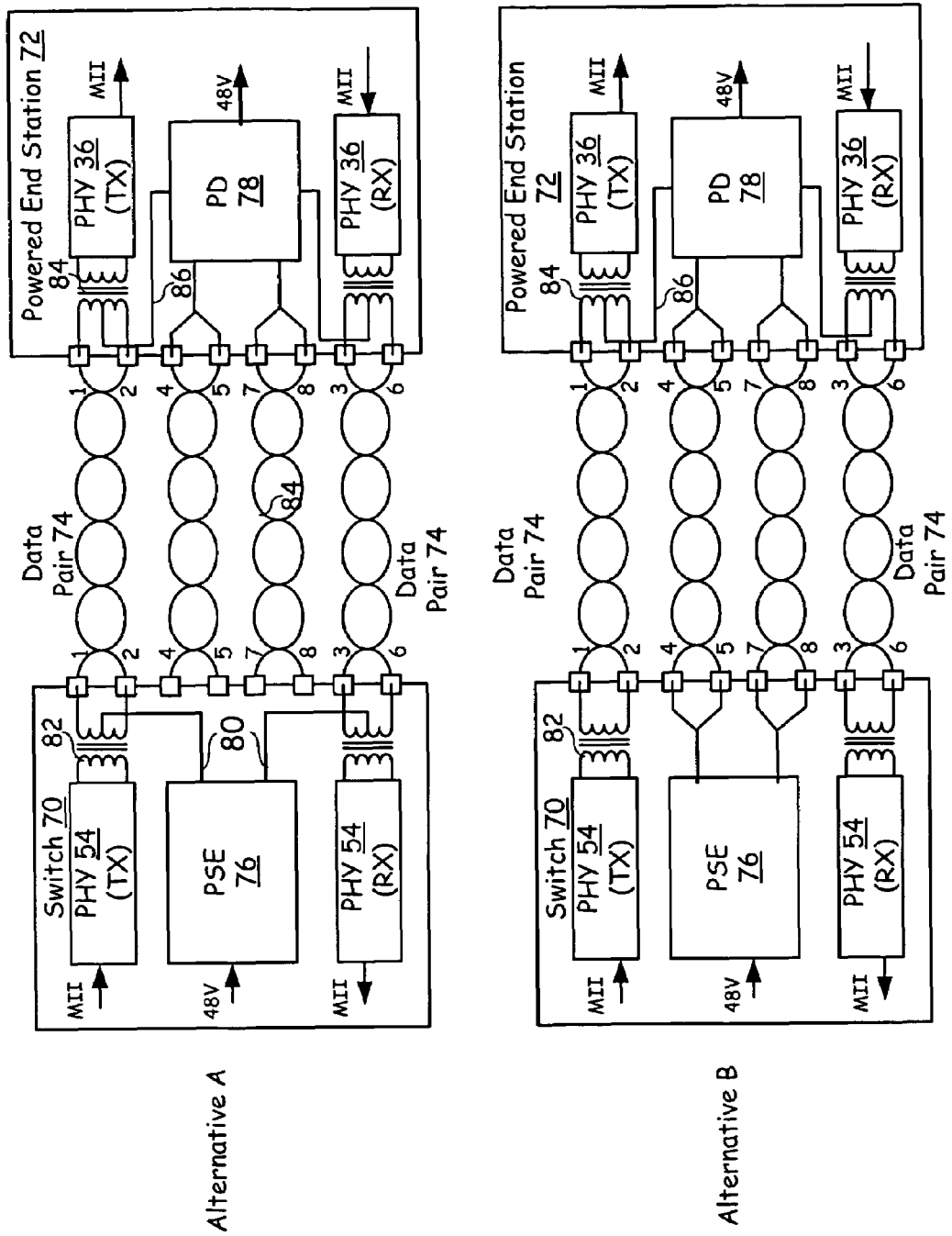
FIG. 4A illustrates two allowed power feeding schemes per the 802.3af standard.
Figure 4B:
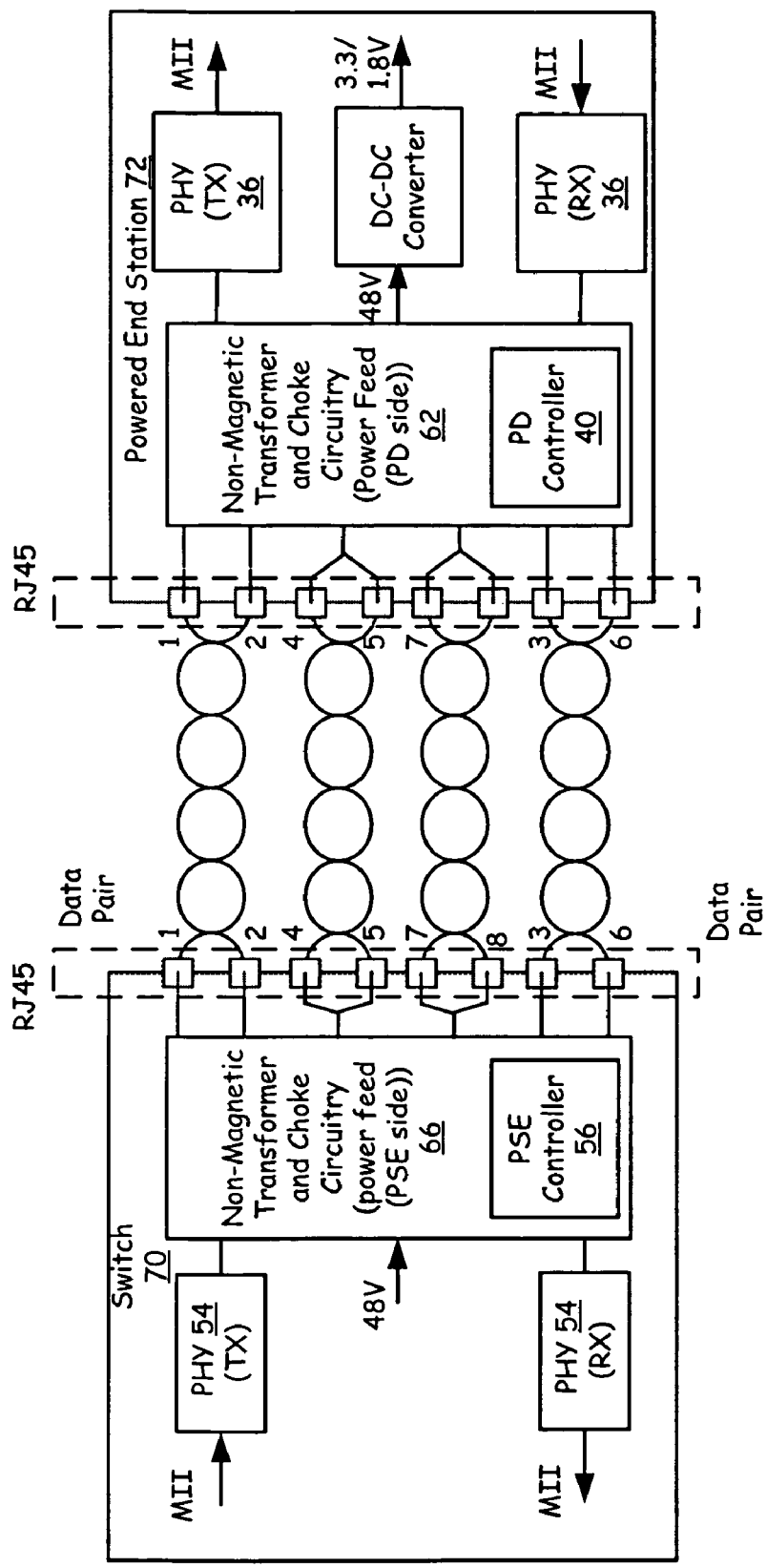
FIG. 4B illustrates the use of embodiments of the present invention to deliver both the power feeding schemes illustrated with FIG. 4A allowed per the 802.3af standard.

FIG. 3B is a functional block diagram of a power-sourcing switch 64 that includes network connector 32, Ethernet or network physical layer 54, PSE controller 56, multi-port switch 58, and non-magnetic transformer and choke power supply circuitry 66. FIG. 3B is similar to that provided in FIG. 2B, wherein the transformer has been replaced with non-magnetic transformer and choke power supply circuitry 66. This power-sourcing switch may be used to supply power to network attached devices in place of the power source equipment disclosed in FIG. 2B.

Network interface 60 and power sourcing switch 64 may be applied to an Ethernet application or other network-based applications such as, but not limited to, a vehicle-based network such as those found in an automobile, aircraft, mass transit system, or other like vehicle. Examples of specific vehicle-based networks may include a local interconnect network (LIN), a controller area network (CAN), or a flex ray network. All of these may be applied specifically to automotive networks for the distribution of power and data within the automobile to various monitoring circuits or for the distribution and powering of entertainment devices, such as entertainment systems, video and audio entertainment systems often found in today's vehicles. Other networks may include a high speed data network, low speed data network, time-triggered communication on CAN (TTCAN) network, a J1939-compliant network, ISO11898-compliant network, an ISO11519-2-compliant network, as well as other like networks known to that having skill in the art. Other embodiments may supply power to network attached devices over alternative networks such as but not limited to a HomePNA local area network and other like networks known to those having skill in the art. The HomePNA uses existing phone wires to share a single network connection within a home or building. Alternatively, embodiments of the present invention may be applied where network data signals are provided over power lines.

Figure 7:
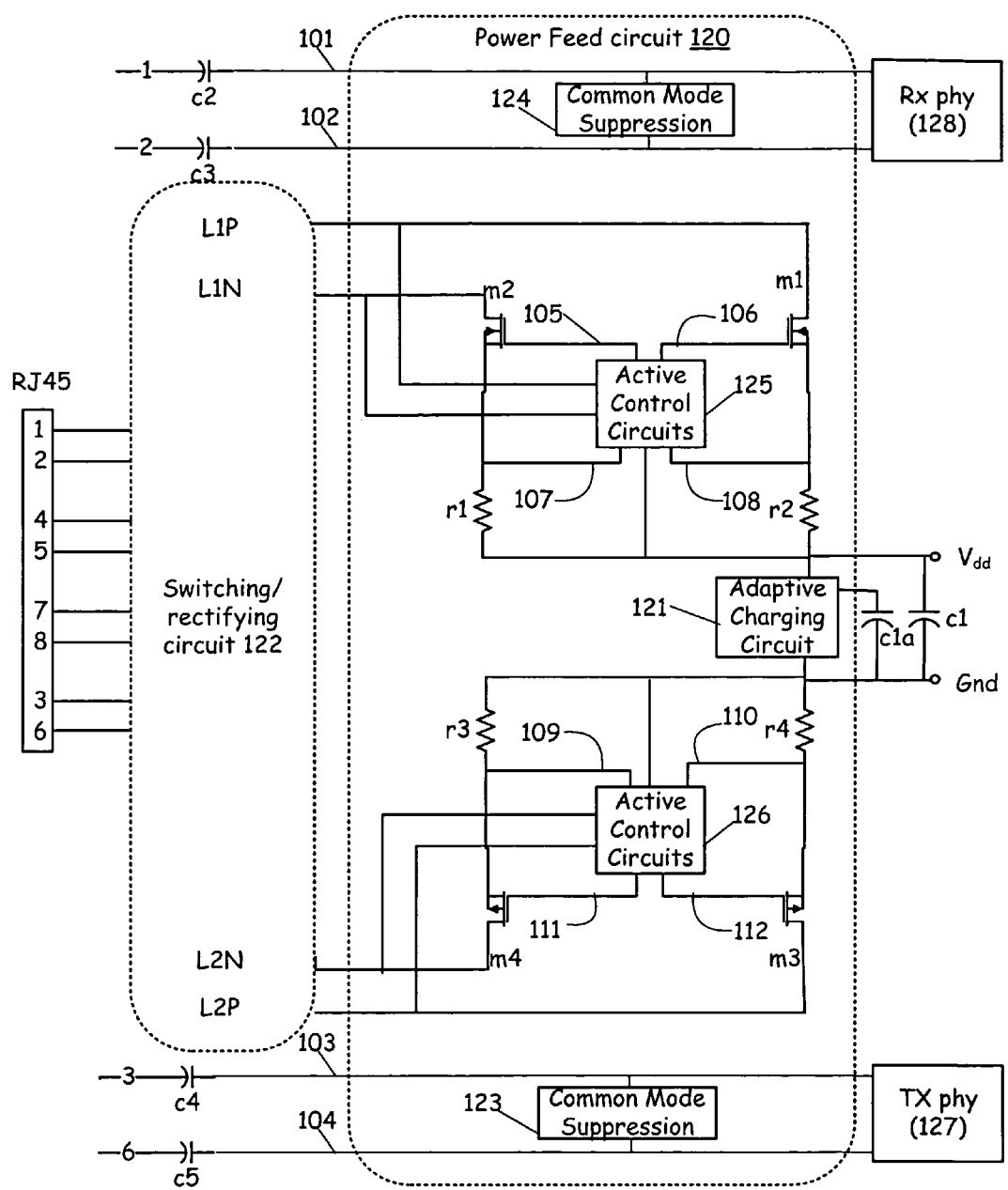
FIG. 7 illustrates one embodiment of a power feed circuit in accordance with an embodiment of the present invention.

Non-magnetic transformer and choke power feed circuitry 62 and 66 eliminate the use of magnetic transformers with integrated system solutions that provide the opportunity to increase system density by replacing magnetic transformers 34 and 52 with solid state power feed circuitry in the form of an IC or discreet component such as the power feed circuit of FIGS. 7, 8A and 8B.

Figure 5:
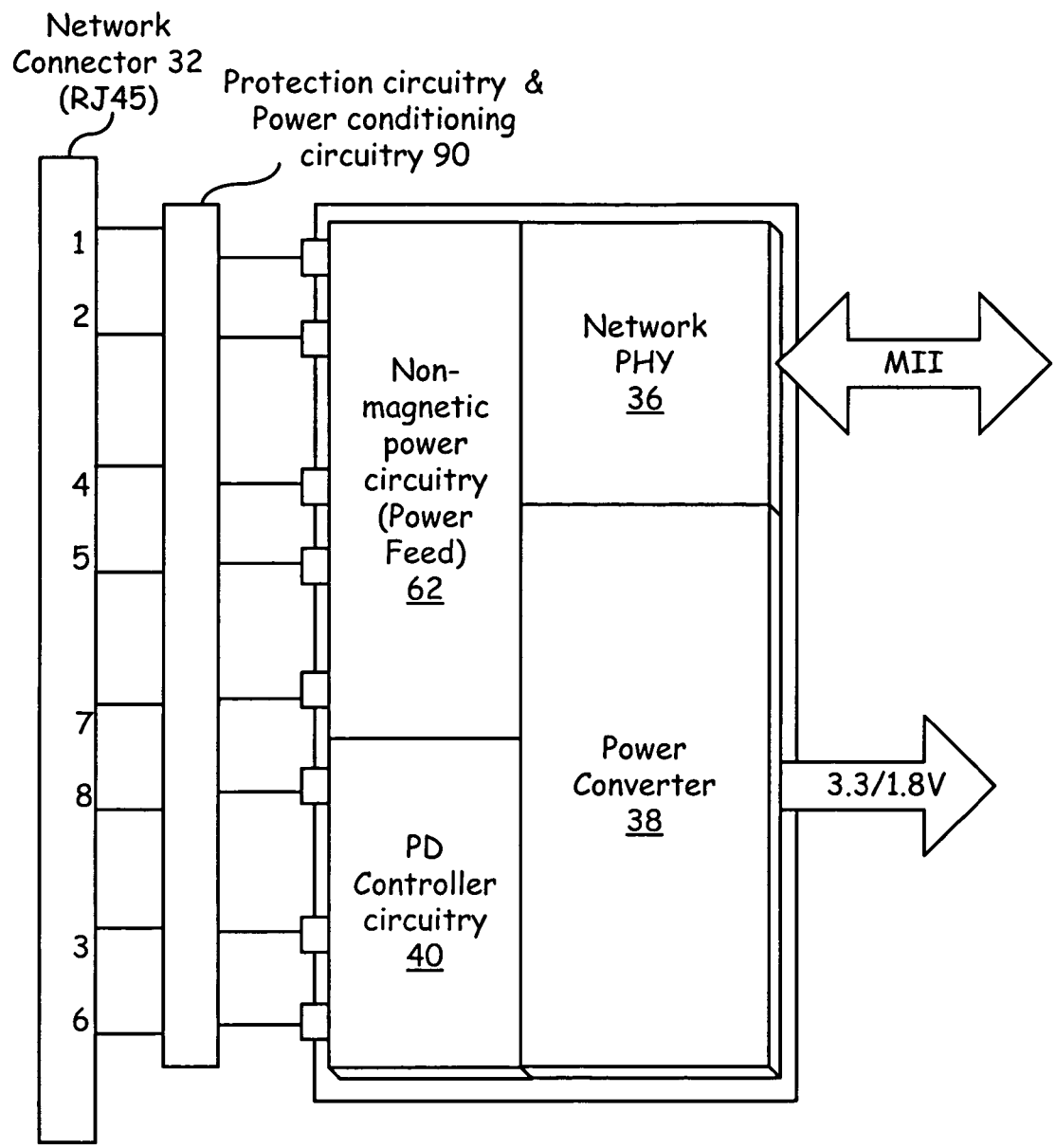
FIG. 5 shows an embodiment of a network powered device (PD) in accordance with an embodiment of the present invention that integrates devices at the IC level for improved performance.

FIG. 5 provides an illustration of an embodiment wherein the non-magnetic transformer and choke power feed circuitry 62, network physical layer 36, power distribution management circuitry 54, and power converter 38 are integrated into a single integrated circuit as opposed to being discrete components at the printed circuit board level. Optional protection and power conditioning circuitry 90 may be used to interface the IC to the network connector.

The Ethernet PHY may support the 10/100/1000 Mbps data rate and other future data networks such as a 10000 Mbps Ethernet network. The non-magnetic transformer and choke power feed circuitry 62 will supply the line power minus the insertion loss directly to the power converter 38. This will convert the power first to a 12 v supply, then subsequently to the lower supply levels. This circuit may be implemented in the 0.18 or 0.13 micron process or other like process known to those having skill in the art.

The non-magnetic transformer and choke power feed circuitry 62 implements three main functions: 802.3.af signaling and load compliance, local unregulated supply generation with surge current protection and signal transfer between the line and integrated Ethernet PHY. As the devices are directly connected to the line, the circuit may be required to withstand a secondary lightning surge. The PD controller may provide control signals to the gates of differential transistors depicted in FIGS. 7 and following. These control signals may limit the insertion losses associated with the AC differential signal as well as equalize the power fed through anyone differential transistor. Portions of this controller may be discussed in further detail with reference to FIG. 7 and following.

In order for the PoE to be 802.3af standard compliant, the PoE may be required to be able to accept power with either power feeding schemes illustrated in FIG. 4A and 4B and handle power polarity reversal. A rectifier, such as a diode bridge, or a switching network, may be implemented to ensure power signals having an appropriate polarity are delivered to the nodes of the power feed circuit. Any one of the conductors 1,4,7 or 3 of the network RJ45 connection can forward bias to deliver current and any one of the return diodes connected can forward bias provide a return current path via one of the remaining conductors. Conductors 2, 5, 8 and 4 are connected in a similar fashion.

The non-magnetic transformer and choke power feed circuitry when applied to PSE may take the form of a single or multiple port switch in order to supply power to single or multiple devices attached to the network. FIG. 3B provides a functional block diagram of power sourcing switch 64 operable to receive power and data signals and then combine these with power signals, which are then distributed via an attached network. In the case where power sourcing switch 64 is a gateway or router, a high-speed uplink couples to a network such as an Ethernet network or other like network. This data signal is relayed via network PHY 54 and then provided to non-magnetic transformer and choke power feed circuitry 66. The PSE switch may be attached to an AC power supply or other internal or external power supply in order to provide a power signal to be distributed to network-attached devices that couple to power sourcing switch 64. Power controller 56 within or coupled to non-magnetic transformer and choke power feed circuitry 66 may determine, in accordance with IEEE standard 802.3af, whether or not a network-attached device, in the case of an Ethernet network-attached device, is a device operable to receive power from power supply equipment. When it is determined in the case of an 802.3af compliant PD is attached to the network, power controller 56 may supply power from power supply to non-magnetic transformer and choke power feed circuitry 66, which is then provided to the downstream network-attached device through network connectors, which in the case of the Ethernet network may be an RJ45 receptacle and cable.

The 802.3af Standard is intended to be fully compliant with all existing non-line powered Ethernet network systems. As a result, the PSE is required to detect via a well defined procedure whether or not the far end is PoE compliant and classify the amount of needed power prior to applying power to the system. Maximum allowed voltage is 57 volts to stay within the SELV (Safety Extra Low Voltage) limits.

In order to be backward compatible with non-powered systems the DC voltage applied will begin at a very low voltage and only begin to deliver power after confirmation that a PoE device is present. In the classification phase, the PSE applies a voltage between 14.5V and 20.5V, measures the current and determines the power class of the device. In one embodiment the current signature is applied for voltages above 12.5V and below 23 Volts. Current signature range is 0-44 mA.

The normal powering mode is switched on when the PSE voltage crosses 42 Volts. At this point the power MOSFETs are enabled and the large bypass capacitor begins to charge.

The maintain power signature is applied in the PoE signature block—a minimum of 10 mA and a maximum of 23.5 kohms may be required to be applied for the PSE to continue to feed power. The maximum current allowed is limited by the power class of the device (class 0-3 are defined). For class 0, 12.95 W is the maximum power dissipation allowed and 400 ma is the maximum peak current. Once activated, the PoE will shut down if the applied voltage falls below 30V and disconnect the power MOSFETs (M1, M2, M3, M4) from the line.

The power feed devices in normal power mode provide a differential open circuit at the Ethernet signal frequencies and a differential short at lower frequencies. The common mode circuit will present the capacitive and power management load at frequencies determined by the gate control circuit.

Figure 6:
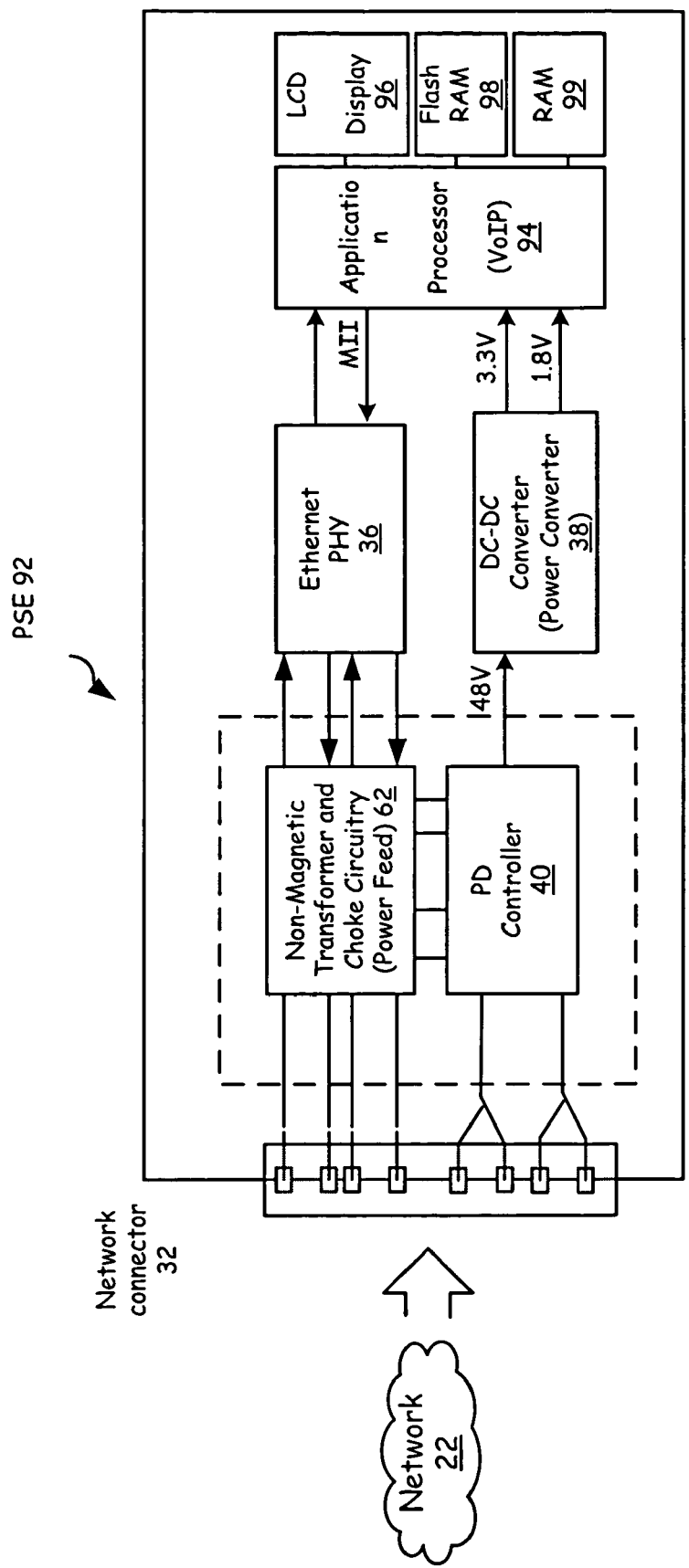
FIG. 6 illustrates the technology associated with embodiments of the present invention as applied in the case of an enterprise VoIP phone.

FIG. 6 provides a functional block diagram of a specific network attached appliance 92. In this case, the network attached appliance is a VOIP telephone. Network connector 32 takes form of an Ethernet network connector, such as RJ45 connector, and passes Ethernet signals to power feed circuitry 62 and PD controller 40. Non-magnetic transformer and choke power feed circuitry 62 separates the data signal and power signal. The data signal is provided to network physical layer 36. Network physical layer 36 couples to a network MAC to execute the network hardware layer. An application specific processor, such as VOIP processor 94 or related processors, couples to the network MAC. Additionally, the VOIP telephone processors and related circuitry (display 96 and memory 98 and 99) may be powered by power converter 38 using power fed and separated from the network signal by non-magnetic transformer and choke power feed circuitry 62. In other embodiments, other network appliances, such as cameras, routers, printers and other like devices known to those having skill in the art are envisioned.

Additional circuits may be used to implement specific functions in accordance with various embodiments of the present invention. One embodiment of a power feed circuit diagram is provided in FIG. 7. FIG. 7 contains a power feed circuit 120 located within non-magnetic transformer and choke power feed circuitry 62. The Ethernet network (network) power signal is received and complies with both alternative A and/or alternative B of 802.3af. Switching/rectifying circuit 122 receives the power signal from the RJ45 connector. The switching/rectifying circuit may receive the output of a surge protection circuit (not shown) or network connector 32, such as the RJ45 connector and rectify or switch the power signal to ensure a power signal with a proper polarity is applied to power feed circuit 120 of a PD. Protection and switching/rectifying circuits may not be required in a back plane application where the polarity of the power signal is known. Switching/rectifying circuit 122 may take the form of a diode bridge or network of switches (i.e. transistors) that may be located within an IC or discrete components. The power signal is provided at nodes L1N and L1P on the receive side and on the transmit side L2N and L2P of the power feed circuit as shown in FIG. 7. The Ethernet power signals pass through differential transistor pairs. The differential transistor pairs are shown as pairs M1 and M2 as well as M3 and M4. Individual Ethernet power signals pass through differential transistor pairs M1 or M2 on the receive side and M3 and M4 on the transmit side. The transistors shown may be MOSFET transistors, bipolar transistors, or other like transistors known to those having skill in the art. The power signal then will pass through a sense impedance such as resistor R1 and R2 on the receive side or R3 and R4 on the transmit side. Although the sense impedance is shown as a purely resistive impedance, this impedance may be a resistor and inductor in parallel or series or other like complex impedances known to those having skilled in the art. At the base of the sense impedance are the two output nodes of the circuit VDD and Ground. Additionally, adaptive charging circuit 121 and capacitors C1 and C1A may be located between the two output nodes. The power converter will receive the power feed from these two nodes in order to power the network attached device.

Active control circuits 125 and 126 may be employed to ensure that the power signals passed through the transistors are of equal magnitude or balanced based on other criteria. Active control circuits 125 and 126 are operable to provide common mode suppression, insertion loss control, and current balancing by controlling the gate by control signals 105, 106, 111 and 112 which are applied to the gates of differential transistors M1, M2, M3 and M4. Additionally, the active control circuits may provide temperature and load control, or other signal conditioning functions.

The active control circuit may receive inputs 107, 108, 109, and 110 from the sense impedances, inputs from common mode suppression circuits 123 and 124, inputs from L1P, L1N, L2N and L2P. Common mode suppression circuits may be placed between conductors 1, 2, 3 and 6 as shown to sample signals 101, 102, 103 and 104 upstream of RX PHY 128 and TX PHY 127. Additionally this circuitry shows for an Ethernet network connection the connection of conductors 1 and 2 to receive side PHY and conductors 3 and 6 on the transmit side PHY with DC locking capacitors that act to only pass the AC portion of the signal. Power feed portion of the circuit as well as the splitting circuitry as exemplified by the DC blocking capacitors and the diode bridge network may be implemented within an integrated circuit. At a minimum the power feed circuit may be implemented as a discreet integrated circuit. Wherein the discreet or several discreet integrated circuits may be utilized on a printed circuit board in order to realize a network interface as provided by the embodiments of the present invention.

Additional circuits may be used to implement specific functions in accordance with various embodiments of the present invention. These circuits may absorb power sent on differential cable pairs.

Figure 8:
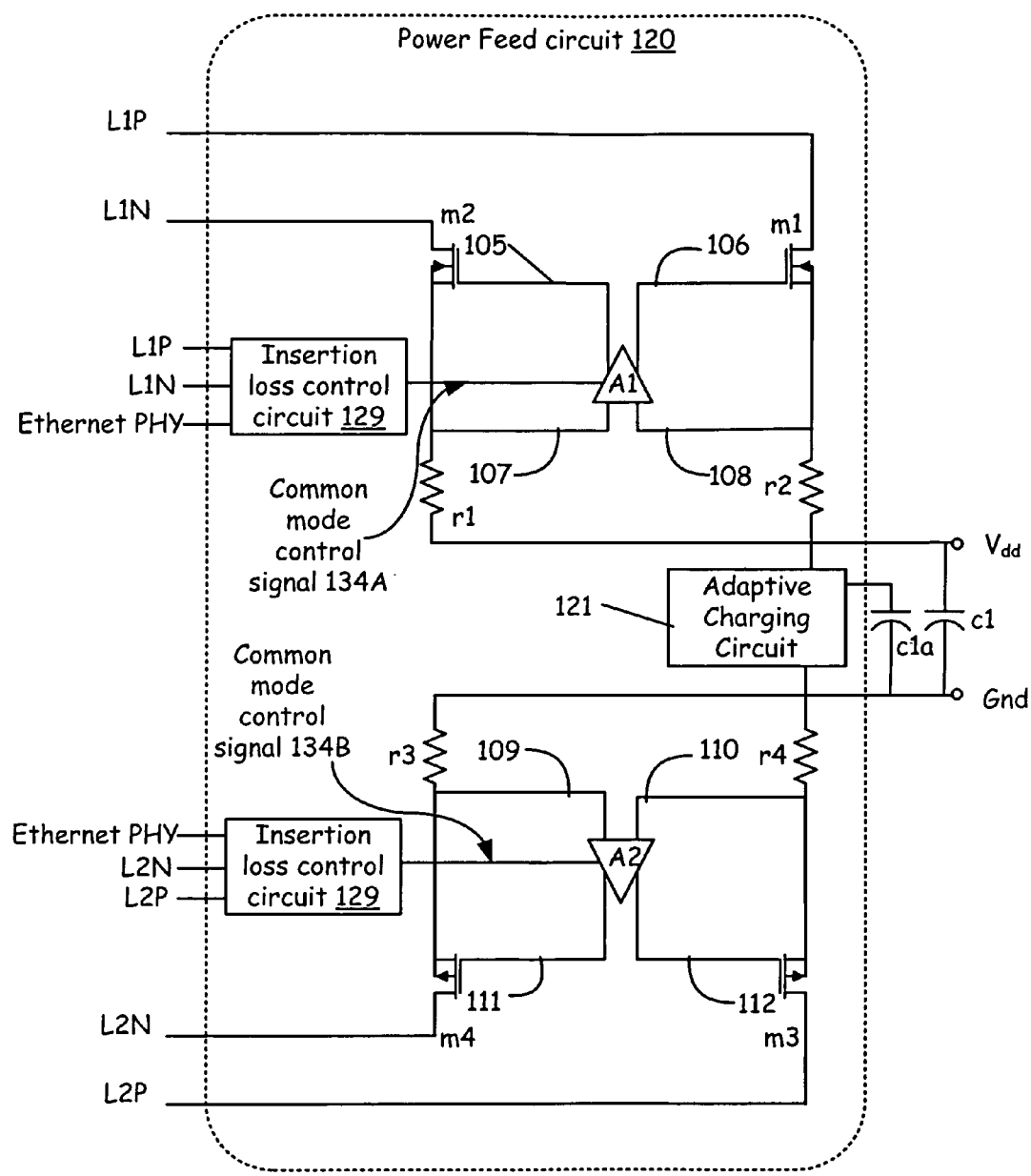
FIG. 8 illustrates one embodiment of a power feed circuit in accordance with an embodiment of the present invention.

A specific circuit diagram is provided in FIG. 8 that describes a portion of the power feed circuit 120 in more detail. Power feed circuit 120 is located within non-magnetic transformer and choke power feed circuitry 62. The Ethernet (network) power signal is received and complies with both alternative A and alternative B of 802.3af as shown in the FIG. 7. Power signals having a proper polarity are applied to the portion of power feed circuit 120 shown here in FIG. 8. The power signal is provided at nodes L1N and L1P on the receive side and on the transmit side L2N and L2P of the power feed circuit 120. The Ethernet power signals pass through differential transistor pairs. In these diagrams the differential transistor pairs are shown as pairs M1 and M2 as well as M3 and M4. Individual Ethernet power signals pass through differential transistor pairs M1 or M2 on the receive side and M3 and M4 on the transmit side. The transistors shown are MOSFET transistors. However, other transistors, such as bipolar transistors or other like transistors known to those having skilled in the art may be used in place of the MOSFET transistors shown. The power signal then will pass through a sense impedance such as resistor R1 and R2 on the receive side or R3 and R4 on the transmit side. Although the sense impedance is shown as a purely resistive impedance, this impedance may be a resistor and inductor in parallel or series or other like complex impedances known to those having skilled in the art. At the base of the sense impedance are the two output nodes of the circuit VDD and Ground. The power converter will receive the power feed from these two nodes in order to power the network attached device.

To ensure that the power signals passed by each transistor are of equal magnitude, amplifier A1 on the receive side and A2 on the transmit side each sense the voltage at the drain of each transistors of the differential transistor pair to which the amplifier is coupled. This voltage equates to the voltage dropped across the sense impedances R1 and R2 or R3 and R4 respectively. The amplifiers A1 and A2 are operable to amplify the difference in voltage between the two voltages and then apply a feedback signal to the gate of individual transistors M1. M2, M3 and M4. This feedback signal forces the Ethernet power signal passed by each transistor of a differential transistor pair to be equal. (i.e. the current of M1 and M2 (or M3 and M4) are equal.)

The power feed portion of circuit 120 as well as the splitting circuitry as exemplified by the DC blocking capacitors shown in FIG. 7 and the switching/rectifying and protection circuitry may be implemented within a single IC. At a minimum the portion of the power feed circuit 120 shown in FIG. 8 may be implemented as a discreet IC. Wherein the discreet or several discreet ICs may be utilized on a PCB in order to realize a network interface as provided by the embodiments of the present invention.

Other embodiment may include additional elements to further provide for dynamic insertion loss control. Minimizing insertion loss allows the delivered power to be maximized. This may be applied to 10/100/1000/10000 megahertz Ethernet signaling, as well as signaling for other network protocols. In one embodiment, the transistors of the differential pair may have a control signal applied to the gate dynamically adjusted depending on what type of signal of 10/100/1000/10000 megahertz. This may be implemented such that the minimal drop is realized from the source to drain of that device as experienced for that particular mode of operation. The insertion loss may be based on the actual received data signal or by determining the type of signaling and applying a predetermined insertion loss for a given type of signal. Mode detection may be performed within the higher level network protocol to determine the type of signal received and associated predetermined insertion loss.

The embodiment of power feed circuit 120 shown in FIG. 8 includes an insertion loss control circuit 129. Insertion loss control circuit 129 may determine the insertion loss limit to be provided based on a differential RMS or peak detection of the received Ethernet power signals as seen by a differential transistor pair. Alternatively, this may be done using the common mode suppression circuit 124 to provide an input to the insertion loss control circuit 129. This input to the insertion loss control circuit is based on sensing the differential RMS or peak voltage seen at L1P and L1N or from twisted pairs 1, 2 and 3, 6. Insertion loss control circuit 129 receives both the insertion loss limit determined from sampling the twisted pairs, nodes L1N, L1P, L2N, and L2P, or from a voltage determined by the Ethernet PHY and fed into insertion control circuit via a connection to PHY 36. These inputs are used to produce a desired common-mode voltage input (insertion loss limit input 132 of FIG. 9) to amplifier A3 of FIG. 10. Amplifier A3 compares the measured common mode input 139 sampled between common mode resistors r1 and r2 with the desired common mode voltage supplied by insertion loss control circuit 129 and adjusts the feedback loop such that they are equal by supplying common mode control signal 134A to amplifier A1 (signal 134B to amplifier A2).

To minimize insertion loss and ensure that the power signals are of equal magnitude amplifier A1 on the receive side and A2 on the transmit side each receive a common mode feedback signal and sense the drain voltages of each transistors of the differential transistor pair, and then produces a control signal which may be applied to the gates of the differential transistors in order to force the power signals passed by the transistors to be equal.

Minimizing insertion loss allows the delivered power to be maximized. This may be applied to 10/100/1000/10000 megahertz Ethernet signaling, as well as signaling for other network protocols. In one embodiment, the transistors of the differential pair may have a control signal applied to the gate dynamically adjusted depending on what type of signal of 10/100/1000/10000 megahertz. This may be implemented such that the minimal drop is realized from the source to drain of that device as experienced for that particular mode of operation. The insertion loss limit may be based on the actual received data signal or by determining the type of signaling and applying a predetermined insertion loss for a given type of signal. Mode detection may be performed within the higher level network protocol to determine the type of signal received and associated predetermined insertion loss. The input to amplifier A1 from the amplifier A3 determines the common mode output of amplifier A1.

Figure 9:
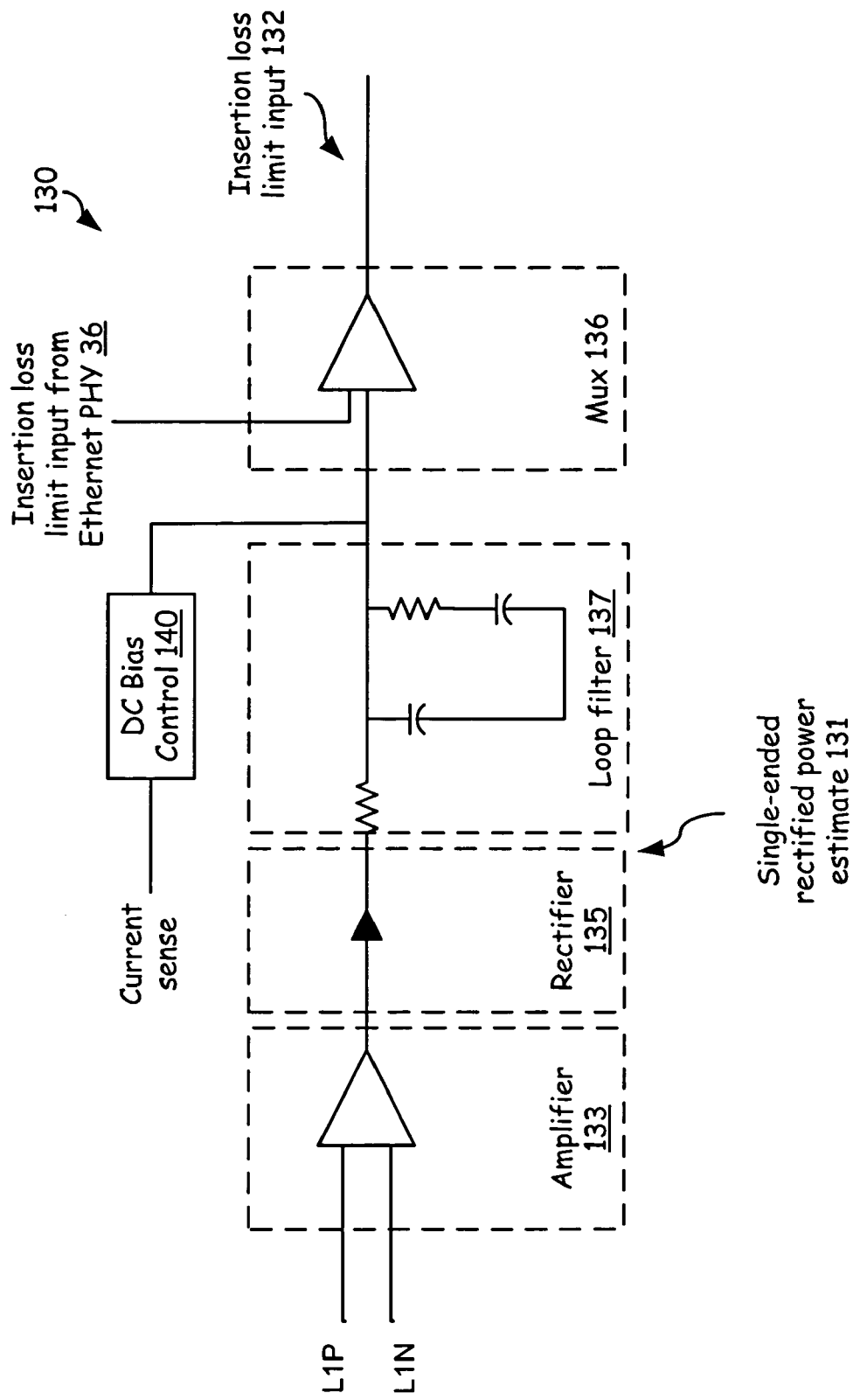
FIG. 9 illustrates one embodiment of an insertion loss circuit in accordance with an embodiment of the present invention.

FIG. 9 provides a functional block diagram of one embodiment of a dynamic insertion loss control limit circuit for a 10/100/1000/10000 megahertz Ethernet PD. Insertion loss control limit circuit 130 includes a differential to single ended amplifier 133, a rectifier 135, and a loop filter 137. Amplifier 133 receives a pair of network signals from nodes L1P and L1N or the twisted pairs within the RJ45 cable and converts the network signal into a single ended estimate 131. Rectifier 135 converts the signal into a power estimate that loop filter 137 uses to produce a common-mode control signal 134. Multiplexer (MUX) 136 can be selected to either pass the power estimate from the loop filter 137 or a voltage determined by the Ethernet PHY (insertion loss limit input 132) to the common mode amplifier A3 of in FIG. 10). Amplifier A3 will drive the common mode level of the power transistors (M1, M2, M3 and M4) to be equal to the rms signal power level. This will ensure that the power feed circuit has the minimal insertion loss to ensure proper functionality. This common mode feedback amplifier provides common mode suppression across a wide bandwidth and can implement the equivalent function to an EMI choke filter.

Figure 10:
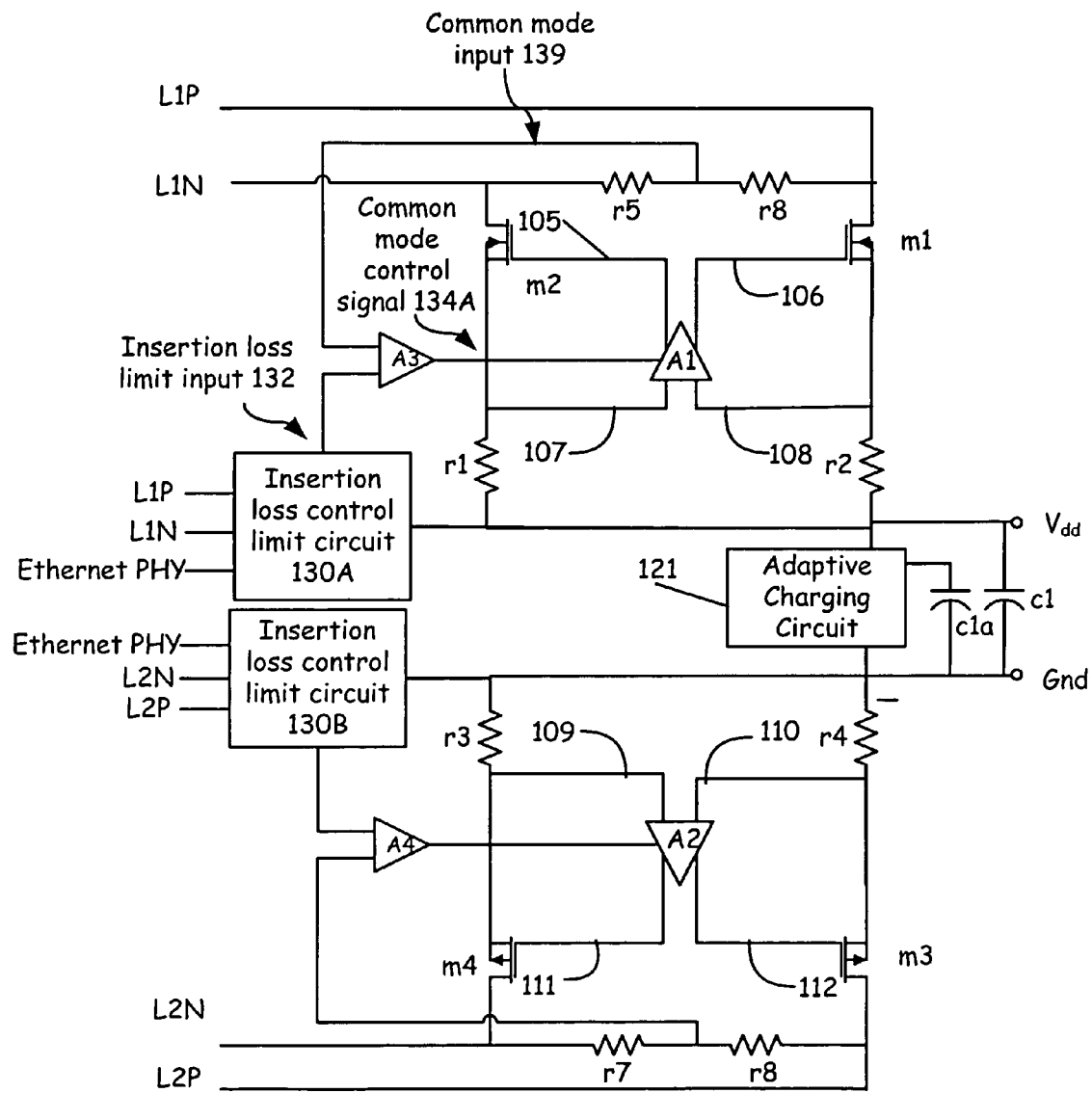
FIG. 10 illustrates one embodiment of a power feed circuit diagram in accordance with an embodiment of the present invention.

FIG. 10 illustrates one embodiment of a power feed circuit in accordance with an embodiment of the present invention where insertion loss control limit circuit 130 and associated amplifiers are used to provide both a common mode feedback signal and a differential feedback signal which is then applied to the gates of the transistors M1, M2, M3, and M4 of the differential transistor pairs. This circuit is similar to the circuits provided and discussed in FIGS. 7 and 8. However the active control circuits and insertion loss control circuit are presented in further detail. Here insertion loss control limit circuit 130 receives inputs either from twisted pair 1, 2 or L1P L1N nodes on the receive side and L2P L2N or twisted pairs 3, 6 on the transmit side. Additionally insertion loss control circuit limit 130 may receive an input from Ethernet PHY 36 to determine an insertion loss limit input 132. This insertion loss control limit is compared to the common mode signal 139 sampled between resistors R5 and R8. Amplifier A3 then is operable to produce a common mode control signal 134 which is then supplied to amplifier A1.

Amplifier A1 sensing the differential voltage at the drains of transistors M1 M2 as well as the common mode control signal 134 is able to generate appropriate control signals 105 and 106 which may then be applied to the gates of transistors M1 and M2. Thus the circuit is able to reduce, minimize, or control insertion losses as well as balancing the power signals seen on each of the individual transistors. The transmit side works similarly where A4 performs the functions that were previously described with reference to amplifier A3.

Figure 11:
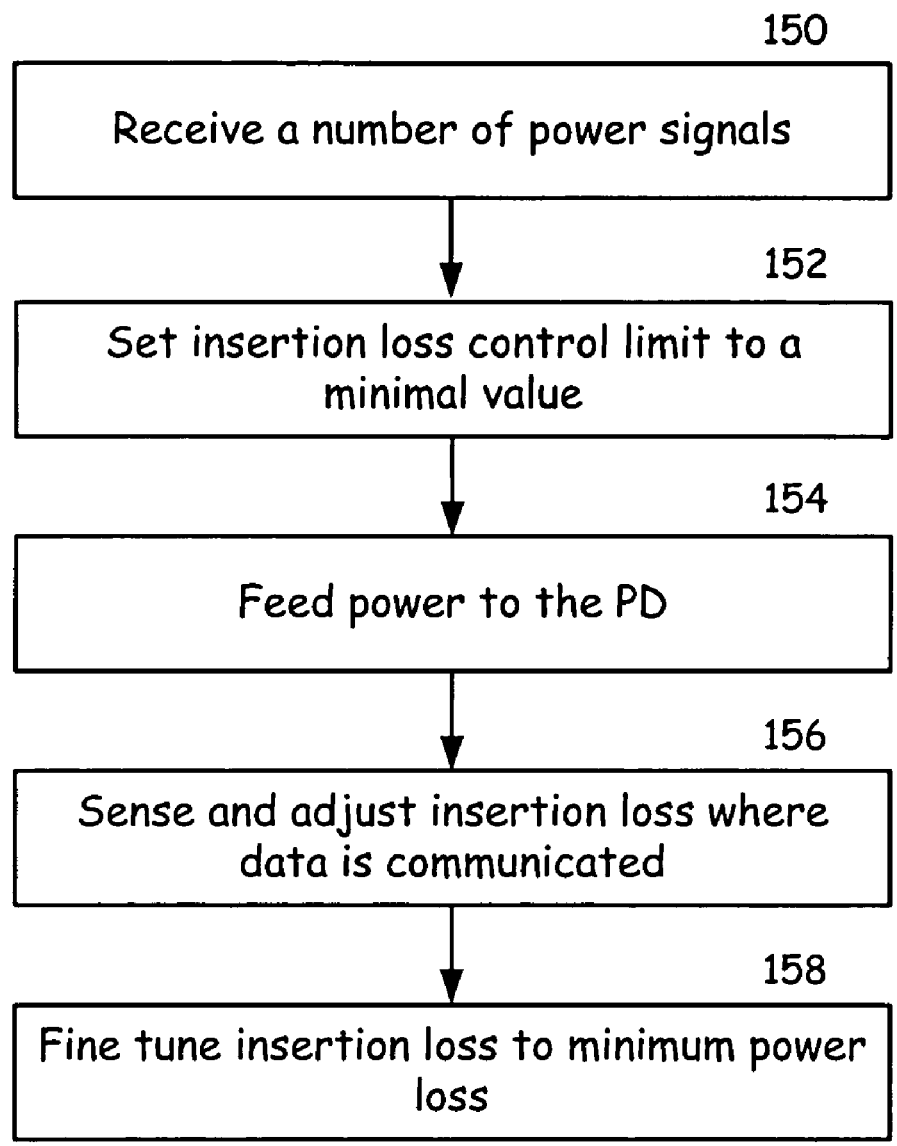
FIG. 11 is a logic flow diagram in accordance with an embodiment of the present invention.

FIG. 11 provides a logic flow diagram that illustrates processing associated with at least partially powering a network-attached device such as an Ethernet device from an Ethernet or network power signal fed through a network or Ethernet connection. This method involves at Step 150 receiving a number of paired network power signals. In Step 152 an insertion loss limit is set initially to a minimum value. This minimum value may be associated with alternative B of 802.3af where power is fed on conductors without communication signals. Power is initially fed to the PD in step 154. Step 156 involves sensing and adjusting the insertion loss where data is communicated on conductors with power. The actual insertion loss limit associated with the may be determined for the received signals based on a differential RMS of the received Ethernet power signals as seen by a differential transistor pair. When the insertion loss limit is determined based on the differential RMS, the insertion loss control circuit is operable to automatically reduce the insertion loss based upon transmission losses experienced over the network connection between the power sending equipment and network-attached device. Alternatively, the insertion loss limit may be determined logically by the higher layers of the network protocol based on the AC differential portion of the network power signal. In yet another embodiment, current through the differential transistors as measured by the voltage at the drain of the differential transistors, or the differential signal swing as measured by the voltage within a resistor bridge across the transistor drains wherein this and supplied to the insertion loss control circuit. The average power of the power signals is sensed and combined with the insertion loss limit to produce a common mode feedback signal in step 156 that tunes the insertion loss to minimize or reduce the insertion loss.

In summary, the present invention provides for dynamic insertion loss control for a 10/100/1000/10000 megahertz Ethernet power device. An insertion loss control circuit limits power loss in a coupled power feed circuit. The insertion loss control circuit determines an insertion loss limit and senses an average power of the power signals to produce a common mode feedback signal to the power feed circuit. The insertion loss limit is determined for the received signals based on a differential RMS of the received Ethernet power signals as seen by a differential transistor pair. Alternatively, the insertion loss limit may be determined logically by the higher layers of the network protocol based on the AC differential portion of the network power signal. When the insertion loss limit is determined based on the differential RMS, the insertion loss control circuit is operable to automatically reduce the insertion loss based upon transmission losses experienced over the network connection between the power sending equipment and network-attached device. As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although embodiments of the present invention are described in detail, it should be understood that various changes, substitutions and alterations can be made hereto without departing from the spirit and scope of the invention.

What is claimed is:

1. An insertion loss control limit circuit operable to supply an insertion loss limit to a coupled power feed circuit, the insertion loss control limit circuit comprising:
   a first amplifier operably coupled to a pair of network power signals, wherein the amplifier is operable to generate a power estimate signal associated with the network power signals;
   a rectifier operable to convert the power estimate signal into a single ended rectified power estimate; and
   a loop filter operable to produce an insertion loss control limit, wherein the insertion loss control limit is based on the received pair of network power signals.

2. The insertion loss control limit circuit of claim 1, further comprising a buffer operable to prevent overloading of the loop filter.

3. The insertion loss control limit circuit of claim 1, wherein the loop filter stabilizes the insertion loss control circuit.

4. The insertion loss control limit circuit of claim 1 operable to reduce the insertion loss based on transmission losses.

5. A power feed circuit operable to supply power to an Ethernet network device coupled to an Ethernet network, comprising:
   two differential transistor pairs wherein each transistor is operable to pass an Ethernet power signal;
   two pairs of impedance sense resistors coupled to a transistor, wherein each impedance sense resistors is operable to pass a Ethernet power signals received from a drain of the coupled transistor;
   an insertion loss control limit circuit operable to provide a insertion loss limit to a common mode feedback amplifier, wherein the common mode feedback amplifier senses an average Ethernet power signal and wherein the common mode feedback amplifier outputs a common mode feedback signal;
   a differential amplifier coupled to the drains of each differential transistor pair, wherein the differential amplifier(s) are operable to: receive the common mode feedback signal;
      amplify a differential voltage across the pair of impedances coupled to the differential transistor pair; and
   apply a feedback signal to a gate of the transistors of each differential transistor pair based on the differential voltage and common mode feedback signal, wherein the applied feedback signal:
   drives the Ethernet power signal passed by each transistor in a differential transistor pair to be equal; and
   reduces the insertion loss to the insertion loss limit; and
   a pair of output nodes, wherein one output node is associated with each differential transistor pair, and wherein the pair of output nodes feed power to the Ethernet network device.

6. The power feed circuit of claim 5, wherein the power feed circuit is implemented as an integrated circuit (IC).

7. The power feed circuit of claim 5, wherein the power feed circuit interfaces to a switching/rectifying circuit operable to rectify an Ethernet power signal.

8. The power feed circuit of claim 7, wherein the switching/rectifying circuit interfaces with a plurality of twisted pairs, wherein the plurality of twisted pairs passes the Ethernet power signal, and wherein the insertion loss limit is determined by an Ethernet PHY based on an Ethernet communication signal.

9. The power feed circuit of claim 5, further comprising splitting circuitry operable to separate a data signal from the Ethernet power signal, and wherein the data signal is passed to an Ethernet PHY module.

10. The power feed circuit of claim 5, wherein the insertion loss control limit circuit couples to the received Ethernet power signals, and wherein the insertion loss limit is based on a differential RM.S root mean square (RMS) of the received Ethernet power signals.

11. The power feed circuit if claim 5, wherein the insertion loss control limit circuit further comprises:
   a first amplifier operably coupled to a pair of Ethernet power signals, wherein the amplifier is operable to generate a power estimate signal associated with the Ethernet power signals;
   a rectifier operable to convert the power estimate signal into a single ended power estimate; and
   a loop filter operable to produce the insertion loss control signal, wherein a speed of the insertion loss control signal is based on the received pair of Ethernet power signals.

12. The power feed circuit if claim 11, wherein the insertion loss control circuit is operable to reduce the insertion loss based on transmission losses.

13. The power feed circuit of claim 5, wherein the average Ethernet power signal is sensed between a pair of common mode impedances across a source of the differential transistor pair.

14. The power feed circuit of claim 9, wherein the splitting circuitry comprises direct current (DC) blocking capacitors.

15. The power feed circuit of claim 6, wherein the integrated circuit (IC) further comprises:
an Ethernet physical layer (PHY) module; an Ethernet media access controller (MAC) wherein the Ethernet PHY module and Ethernet MAC are operable to implement hardware layers of an Ethernet protocol stack;
a power management module; and
Ethernet network device specific processors and memory.

16. The power feed circuit of claim 5, operable to provide:
a high differential mode impedance across the pair of output nodes with the differential amplifier; and
a low common mode impedance across the pair of output nodes with the common mode amplifier.

17. A method to at least partially power an Ethernet network powered device, from an Ethernet power signal fed through an Ethernet network connection, comprising:
receiving a plurality of paired Ethernet power signals;
passing each pair of Ethernet power signal through a differential transistor pairs;
sensing a drain voltage at a drain of each transistor;
determining an insertion loss limit associated with the Ethernet power signals;
determining a common mode feedback signal based on the Ethernet power signals and insertion loss limit; comparing the drain voltages of each differential transistor producing a pair of control signals for each differential transistor pair based on:
the comparison of the drain voltages of each differential transistor pair; and
the common mode feedback signal;
applying the control signal to a gate of each transistor, wherein the control signal:
equalizes the Ethernet power signal passed by each transistor in a differential transistor pair; and
limits the insertion loss associated with the Ethernet power signal; and
passing the Ethernet power signal from a pair of output nodes wherein one output node is associated with each differential transistor pair, and wherein the pair of output nodes feed power to the Ethernet network device.

18. The method of claim 17, wherein the insertion loss limit is based on a differential root mean square (RMS) of the received Ethernet power signals.

19. The method of claim 17, wherein the insertion loss limit is determined by an Ethernet PHY based on an Ethernet communication signal.

20. The method of claim 17, further comprising:
physically coupling the Ethernet network device to the Ethernet network;
receiving an Ethernet signal from the Ethernet network, wherein the Ethernet signal comprises the plurality of Ethernet power signals and/or communication signal(s); and
rectifying the Ethernet power signals.

21. The method of claim 17, wherein:
an RJ45 connector physically couples the Ethernet network device to the Ethernet network, and wherein the RJ45 connector couples to twisted pairs that further comprise conductors 1 and 2; 3 and 6; 4 and 5; and 7 and 8; and a diode bridge network rectifies the Ethernet power signal received utilizing conductors 1, 2, 3, and 6 or conductors 4, 5, 7, and 8.

* * * * *